(12) United States Patent
Tao

(10) Patent No.: US 11,825,621 B2
(45) Date of Patent: Nov. 21, 2023

(54) FOLDING METAL BACK PLATE

(71) Applicant: DARWIN PRECISIONS CORPORATION, Hsinchu County (TW)

(72) Inventor: Ching-Wen Tao, Taoyuan (TW)

(73) Assignee: DARWIN PRECISIONS CORPORATION, Hukou Township, Hsinchu County (TW)

(*) Notice: Subject to any disclaimer, the term of this patent is extended or adjusted under 35 U.S.C. 154(b) by 192 days.

(21) Appl. No.: 17/375,642

(22) Filed: Jul. 14, 2021

(65) Prior Publication Data

US 2022/0369485 A1 Nov. 17, 2022

(30) Foreign Application Priority Data

May 13, 2021 (TW) .................. 110117357

(51) Int. Cl.
*H05K 5/02* (2006.01)
*B32B 3/02* (2006.01)
(Continued)

(52) U.S. Cl.
CPC ............. *H05K 5/0226* (2013.01); *B32B 3/02* (2013.01); *B32B 3/04* (2013.01); *B32B 3/12* (2013.01); *B32B 3/20* (2013.01); *B32B 7/022* (2019.01); *B32B 7/04* (2013.01); *F16C 11/12* (2013.01); *G09F 9/00* (2013.01); *G09F 9/301* (2013.01); *H05K 5/0017* (2013.01);
(Continued)

(58) Field of Classification Search
CPC ...... H05K 5/0226; H05K 5/04; H05K 5/0052; H05K 5/0017; G09F 9/301; G09F 9/00; B32B 3/02; B32B 3/04; B32B 3/12; B32B 3/20; B32B 7/022; B32B 7/04; Y10T 428/12188; Y10T 428/12201; Y10T 428/12229; Y10T 428/12354; Y10T 428/12368; Y10T 428/12375; F16C 11/12; F16C 2370/00; F16C 2380/00
See application file for complete search history.

(56) References Cited

U.S. PATENT DOCUMENTS

2021/0165454 A1* 6/2021 Dong .................... G06F 1/1652

FOREIGN PATENT DOCUMENTS

CN 110992828 A * 4/2020

OTHER PUBLICATIONS

Machine Translation, Dong et al., CN 110992828 A, Apr. 2020. (Year: 2020).*

* cited by examiner

*Primary Examiner* — Michael E. La Villa
(74) *Attorney, Agent, or Firm* — Muncy, Geissler, Olds & Lowe, P.C.

(57) ABSTRACT

A folding metal back plate includes a first plate portion, a second plate portion, and a folding plate portion connected to the first plate portion and the second plate portion. The folding plate portion has two first folding areas respectively disposed close to the first plate portion and the second plate portion, and a second folding area formed between the two first folding areas. The first folding area has multiple rows of spaced first openings. The second folding area has multiple rows of spaced second openings. Each first folding area constitutes a first unfolding length. The second folding area constitutes a second unfolding length. The first unfolding length of the first folding area is 0.2 to 0.5 times the second unfolding length of the second folding area.

3 Claims, 2 Drawing Sheets

(51) Int. Cl.
*B32B 7/022* (2019.01)
*G09F 9/30* (2006.01)
*B32B 3/04* (2006.01)
*B32B 7/04* (2019.01)
*B32B 3/12* (2006.01)
*B32B 3/20* (2006.01)
*H05K 5/04* (2006.01)
*H05K 5/00* (2006.01)
*F16C 11/12* (2006.01)
*G09F 9/00* (2006.01)

(52) U.S. Cl.
CPC .............. *H05K 5/0052* (2013.01); *H05K 5/04* (2013.01); *F16C 2370/00* (2013.01); *F16C 2380/00* (2013.01); *Y10T 428/12188* (2015.01); *Y10T 428/12201* (2015.01); *Y10T 428/12229* (2015.01); *Y10T 428/12354* (2015.01); *Y10T 428/12368* (2015.01); *Y10T 428/12375* (2015.01)

FOLDING METAL BACK PLATE

BACKGROUND OF THE INVENTION

1. Field of the Invention

The present invention relates to display device technology and more particularly, to a folding metal back plate for display device.

2. Description of the Related Art

The known folding metal back plate is not properly configured, and the bending part is easy to form a semi-ellipse, which generates a lot of bending stress, and reduces its bending life, so it needs to be improved.

SUMMARY OF THE INVENTION

The present invention has been accomplished under the circumstances in view. It is the main object of the present invention to provide a folding metal back plate, which can compensate to make it bend in a true arc shape, the folding operation is smoother, and the bending stress is reduced.

To achieve this and other objects of the present invention, a folding metal back plate comprises a first plate portion, a second plate portion, and a folding plate portion connected to the first plate portion and the second plate portion. The folding plate portion comprises two first folding areas respectively disposed close to the first plate portion and the second plate portion, and a second folding area formed between the two first folding areas. The first folding area comprises multiple rows of spaced first openings. The second folding area comprises multiple rows of spaced second openings. Each first folding area constitutes a first unfolding length. The second folding area constitutes a second unfolding length. The first unfolding length of the first folding area is 0.2 to 0.5 times the second unfolding length of the second folding area.

With the first unfolding length of the first folding area being 0.2 to 0.5 times the second unfolding length of the second folding area, the bending can be made into a more positive arc shape, thereby reducing the bending stress and making the folding operation smoother.

Preferably, the first unfolding length of the first folding area is 0.2 to 0.4 times the second unfolding length of the second folding area.

Preferably, the first unfolding length of the first folding area is 0.3 to 0.5 times the second unfolding length of the second folding area.

Preferably, the ratio of all the first openings in the first folding area to the total area of the first folding area constitutes a first opening ratio; the ratio of all the second openings in the second folding area to the total area of the second folding area constitutes a second opening ratio; the first opening ratio of the first folding area is greater than the second opening ratio of the second folding area by 25% to 36%.

Preferably, the first opening ratio of the first folding area is preferably greater than the second opening ratio of the second folding area by 25% to 28%.

Preferably, the first opening ratio of the first folding area is preferably greater than the second opening ratio of the second folding area by 29% to 36%.

Preferably, the first opening ratio of the first folding area is preferably greater than the second opening ratio of the second folding area by 32% to 36%.

Preferably, the second opening ratio of the second folding area is between 75% and 99%.

Preferably, the second opening ratio of the second folding area is preferably between 75% and 85%.

Preferably, the second opening ratio of the second folding area is preferably between 88% and 99%.

DETAILED DESCRIPTION OF THE INVENTION

Figure 1:
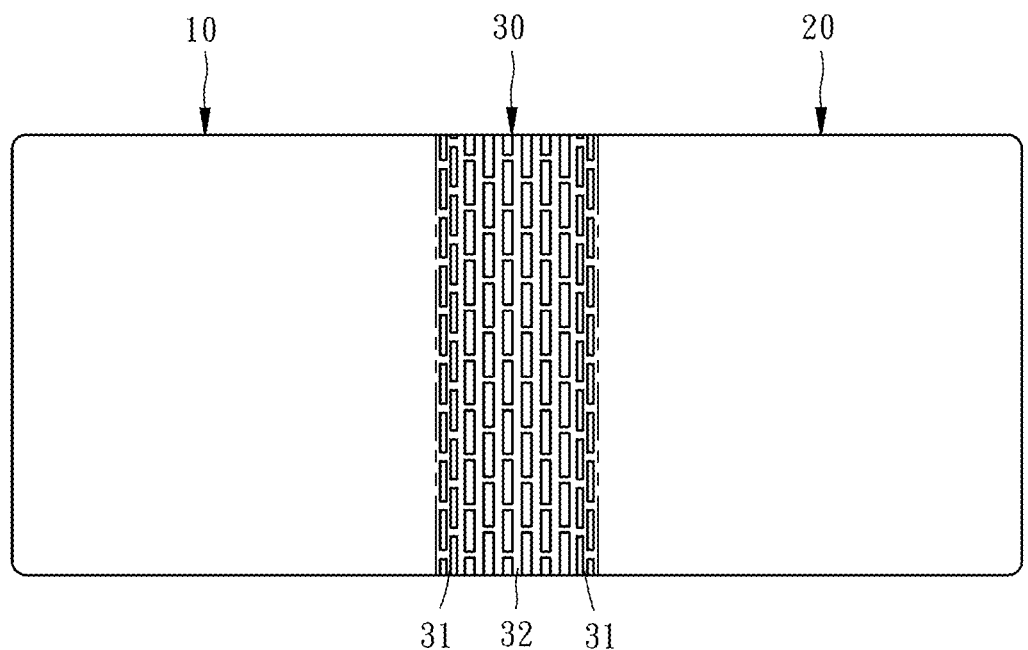
FIG. 1 is a top view of a folding metal back plate in accordance with a preferred embodiment of the present invention.
Figure 2:
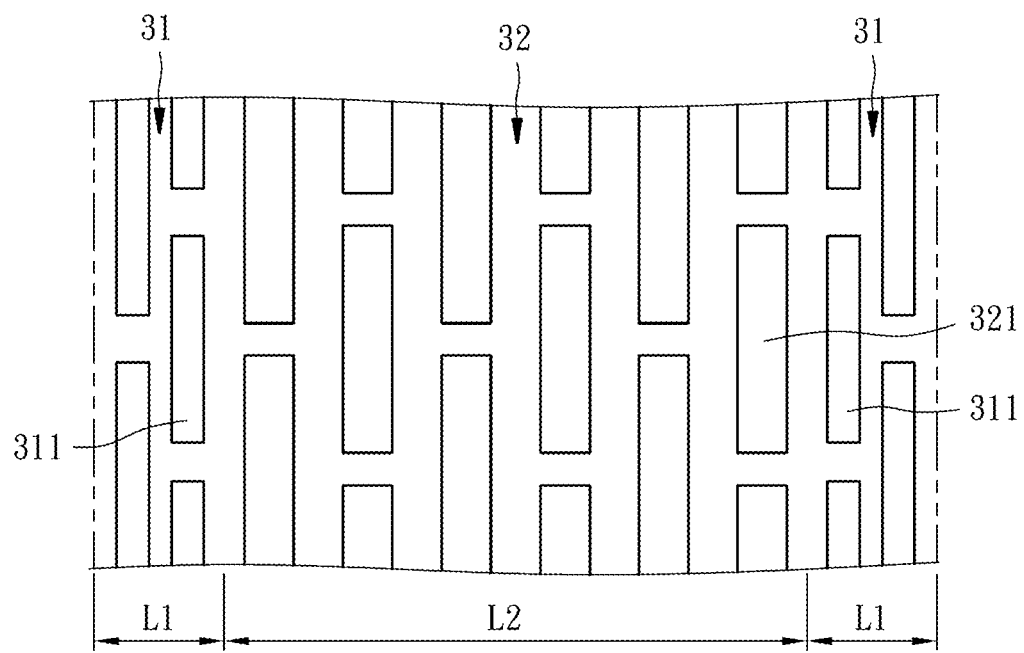
FIG. 2 is an enlarged view of a part of the folding plate portion of the folding metal back plate shown in FIG. 1.
Figure 3:
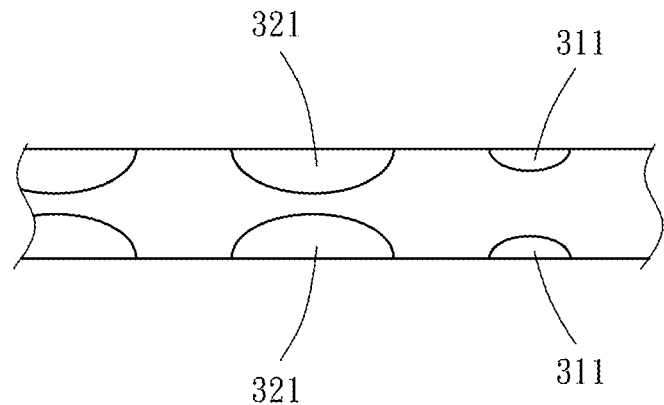
FIG. 3 is a sectional front view of the folding metal back plate shown in FIG. 1.

Hereinafter, the present invention will be further described in conjunction with the accompanying drawings and embodiments.

Referring to FIGS. 1-4, a folding metal back plate in accordance with a preferred embodiment of the present invention comprises:

a first plate portion 10 located on one side of a display unit;

a second plate portion 20 located on one side of the display unit corresponding to the first plate portion 10; and a folding plate portion 30 connected to the first plate portion 10 and the second plate portion 20.

The folding plate portion 30 comprises two first folding areas 31 respectively disposed close to the first plate portion 10 and the second plate portion 20, and a second folding area 32 formed between the two first folding areas 31. The second folding area 32, in principle, is configured to the entire width.

The folded outer side of each of the two first folding areas 31 is almost arc-shaped and forms a bending radius R, which is the so-called R angle.

The first folding area 31 has multiple rows of spaced first openings 311, and the second folding area 32 has multiple rows of spaced second openings 321. The first openings 311 and the second openings 321 are not limited to the double-sided grooves as shown, they can also be single-sided grooves, or slots directly through; they can also be multiple backplates in various permutations and combinations of the various slot or hole configurations.

Each first folding area 31 constitutes a first unfolding length L1, and the second folding area 32 constitutes a second unfolding length L2.

Broadly speaking, the first unfolding length L1 of the first folding area 31 is 0.2 to 0.5 times the second unfolding length L2 of the second folding area 32.

In another broad sense, the first unfolding length L1 of the first folding area 31 is 0.2 to 0.4 times the second unfolding length L2 of the second folding area 32.

In still another broad sense, the first unfolding length L1 of the first folding area 31 is 0.3 to 0.5 times the second unfolding length L2 of the second folding area 32.

Narrowly, the first unfolding length L1 of the first folding area 31 is 0.2 to 0.3 times the second unfolding length L2 of the second folding area 32.

Still narrowly, the first unfolding length L1 of the first folding area 31 is 0.3 to 0.4 times the second unfolding length L2 of the second folding area 32.

Still narrowly, the first unfolding length L1 of the first folding area 31 is 0.4 to 0.5 times the second unfolding length L2 of the second folding area 32.

Definition of opening ratio:

The ratio of all first openings 311 in the first folding area 31 to the total area of the first folding area 31 constitutes a first opening ratio.

The ratio of all second openings 321 in the second folding area 32 to the total area of the second folding area 32 constitutes a second opening ratio.

The opening ratio gap test data is as follows:

| second opening ratio (%) | first opening ratio (%) | opening ratio difference (%) | R angle (mm) | Number of bends (thousand) |
|---|---|---|---|---|
| 77 | 41 | 36 | 5 | >206 |
| 78 | 49 | 29 | 5 | >208 |
| 77 | 52 | 25 | 5 | >188 |
| 78 | 38 | 40 | 5 | >180 |
| 77 | 54 | 23 | 5 | >160 |
| 77 | 61 | 16 | 5 | >130 |
| 79 | 63 | 16 | 5 | >160 |
| 75 | 62 | 13 | 5 | >100 |
| 83 | 58 | 25 | 5 | >200 |
| 85 | 58 | 27 | 5 | >200 |
| 88 | 56 | 32 | 5 | >250 |
| 90 | 57 | 33 | 5 | >250 |
| 99 | 64 | 35 | 5 | >250 |

Optimally, the first opening ratio of the first folding area 31 is smaller than the second opening ratio of the second folding area 32 by 32% to 36%.

Suboptimally, the first opening ratio of the first folding area 31 is smaller than the second opening ratio of the second folding area 32 in the range of 29% to 36%.

Preferably, the first opening ratio of the first folding area 31 is smaller than the second opening ratio of the second folding area 32 by 25% to 28%.

Based on the above, the first opening ratio of the first folding area 31 is smaller than the second opening ratio of the second folding area 32 by 25% to 36%.

Optimally, the second opening ratio of the second folding area 32 is between 88% and 99%.

Suboptimally, the second opening ratio of the second folding area 32 is between 75% and 85%.

In summary, the second opening ratio of the second folding area 32 is between 75% and 99%.

Figure 4:
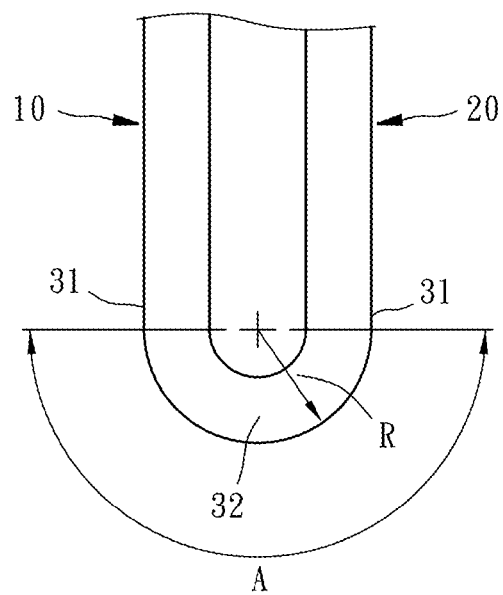
FIG. 4 is a schematic diagram of the bending and folding of the folding metal back plate shown in FIG. 1.

By using the first unfolding length L1 of the first folding area 31 to be 0.2 to 0.5 times the second unfolding length L2 of the second folding area 32, the second folding area 32 after folding becomes a correct arc shape and forms a covering angle A. The covering angle A is preferably 180 degrees, but it is not limited, as shown in FIG. 4; therefore, the bending stress can be reduced, the folding operation is smoother, and the purpose of the invention is indeed achieved.

In addition, the first opening ratio of the first folding area 31 is greater than the second opening ratio of the second folding area 32, which is bounded by the various interval values, so that the effect of the present invention can be better.

What is claimed is:

1. A folding metal back plate, comprising:
   a first plate portion;
   a second plate portion; and
   a folding plate portion connected to said first plate portion and said second plate portion, said folding plate portion comprising two first folding areas respectively disposed close to said first plate portion and said second plate portion and a second folding area formed between said two first folding areas, said first folding area comprising multiple rows of spaced first openings, said second folding area comprising multiple rows of spaced second openings, each said first folding area constituting a first unfolding length, said second folding area constituting a second unfolding length, said first unfolding length of each said first folding area being 0.2 to 0.5 times said second unfolding length of said second folding area,
   wherein a ratio of all said first openings in said first folding area to a total area of said first folding area constitutes a first opening ratio, a ratio of all said second openings in said second folding area to a total area of said second folding area constitutes a second opening ratio,
   wherein said first opening ratio of each said first folding area is between 41% and 49%, and
   wherein said second opening ratio of said second folding area is between 77% and 78%.

2. A folding metal back plate, comprising:
   a first plate portion;
   a second plate portion; and
   a folding plate portion connected to said first plate portion and said second plate portion, said folding plate portion comprising two first folding areas respectively disposed close to said first plate portion and said second plate portion and a second folding area formed between said two first folding areas, said first folding area comprising multiple rows of spaced first openings, said second folding area comprising multiple rows of spaced second openings, each said first folding area constituting a first unfolding length, said second folding area constituting a second unfolding length, said first unfolding length of each said first folding area being 0.2 to 0.5 times said second unfolding length of said second folding area;
   wherein a ratio of all said first openings in said first folding area to a total area of said first folding area constitutes a first opening ratio, a ratio of all said second openings in said second folding area to a total area of said second folding area constitutes a second opening ratio,
   wherein said first opening ratio of each said first folding area is 58%, and
   wherein said second opening ratio of said second folding area is between 83% and 85%.

3. A folding metal back plate, comprising:
   a first plate portion;
   a second plate portion; and
   a folding plate portion connected to said first plate portion and said second plate portion, said folding plate portion comprising two first folding areas respectively disposed close to said first plate portion and said second plate portion and a second folding area formed between said two first folding areas, said first folding area comprising multiple rows of spaced first openings, said second folding area comprising multiple rows of spaced second openings, each said first folding area constituting a first unfolding length, said second folding area constituting a second unfolding length, said first unfolding length of each said first folding area being 0.2 to 0.5 times said second unfolding length of said second folding area, wherein a ratio of all said first openings in said first folding area to a total area of said first folding area constitutes a first opening ratio, a ratio of all said second openings in said second folding area to a total area of said second folding area constitutes a second opening ratio, wherein said first opening ratio of each said first folding area is between 56% and 57%, and wherein said second opening ratio of said second folding area is between 88% and 90%.

* * * * *